US008994027B2

(12) United States Patent
Lee

(10) Patent No.: US 8,994,027 B2
(45) Date of Patent: Mar. 31, 2015

(54) THIN FILM TRANSISTOR ARRAY SUBSTRATE, ORGANIC LIGHT-EMITTING DISPLAY DEVICE INCLUDING THE SAME, AND METHOD OF MANUFACTURING THE SAME

(71) Applicant: Samsung Display Co., Ltd., Yongin, Gyeonggi-do (KR)

(72) Inventor: Dae-Woo Lee, Yongin (KR)

(73) Assignee: Samsung Display Co., Ltd., Yongin, Gyeonggi-Do (KR)

(*) Notice: Subject to any disclaimer, the term of this patent is extended or adjusted under 35 U.S.C. 154(b) by 0 days.

(21) Appl. No.: 13/801,744

(22) Filed: Mar. 13, 2013

(65) Prior Publication Data

US 2014/0084264 A1  Mar. 27, 2014

(30) Foreign Application Priority Data

Sep. 25, 2012  (KR) .......................... 10-2012-0106588

(51) Int. Cl.
*H01L 51/50* (2006.01)
*H01L 27/12* (2006.01)
*H01L 27/32* (2006.01)

(52) U.S. Cl.
CPC .......... *H01L 27/124* (2013.01); *H01L 27/1288* (2013.01); *H01L 27/1214* (2013.01); *H01L 51/50* (2013.01); *H01L 27/1255* (2013.01); *H01L 27/326* (2013.01); *H01L 2227/323* (2013.01)
USPC ................. 257/71; 257/72; 257/98; 257/379; 257/E51.019; 257/E51.022

(58) Field of Classification Search
CPC .............. H01L 27/124; H01L 27/1214; H01L 27/1255; H01L 51/50
USPC .......... 257/71, 72, 98, 379, E51.019, E51.022
See application file for complete search history.

(56) References Cited

U.S. PATENT DOCUMENTS

| 6,771,328 | B2* | 8/2004 | Park et al. ........................ 349/42 |
| 7,888,860 | B2 | 2/2011 | Sung et al. |
| 8,319,221 | B2* | 11/2012 | Choi et al. ........................ 257/59 |
| 8,866,145 | B2* | 10/2014 | Choi et al. ........................ 257/72 |
| 2004/0095545 | A1* | 5/2004 | Washizawa et al. .......... 349/155 |

(Continued)

FOREIGN PATENT DOCUMENTS

| JP | 2006-269329 A | 10/2006 |
| KR | 10-2008-0018557 A | 2/2008 |
| KR | 10-2012-0004785 A | 1/2012 |

*Primary Examiner* — Zandra Smith
*Assistant Examiner* — Toniae Thomas
(74) *Attorney, Agent, or Firm* — Knobbe Martens Olson & Bear LLP

(57) ABSTRACT

A thin film transistor (TFT) array substrate includes a TFT including an active layer, a gate electrode, a source electrode, a drain electrode, a first gate insulating layer and a second gate insulating layer formed between the active layer and the gate electrode, and an interlayer insulating layer formed between the gate electrode and the source electrode and the drain electrode; a pixel electrode formed in an opening of the interlayer insulating layer, the pixel electrode including transparent conductive oxide; a translucent electrode formed in a region corresponding to the pixel electrode, between the first gate insulating layer and the second gate insulating layer; and a capacitor including a lower electrode formed from the same layer as the active layer, and an upper electrode formed from the same layer as the translucent electrode.

12 Claims, 5 Drawing Sheets

(56) References Cited

U.S. PATENT DOCUMENTS

| | | |
|---|---|---|
| 2006/0214573 A1 | 9/2006 | Maeda et al. |
| 2011/0114960 A1* | 5/2011 | Lee et al. .................. 257/71 |
| 2011/0297944 A1* | 12/2011 | Choi et al. .................. 257/59 |
| 2012/0007083 A1 | 1/2012 | You et al. |
| 2012/0012890 A1* | 1/2012 | Lee et al. .................. 257/100 |
| 2012/0074414 A1* | 3/2012 | Lee et al. .................. 257/59 |
| 2012/0104396 A1* | 5/2012 | Pyo .................. 257/59 |
| 2012/0104399 A1* | 5/2012 | Choi et al. .................. 257/59 |
| 2012/0146033 A1* | 6/2012 | Lee et al. .................. 257/59 |
| 2013/0015456 A1* | 1/2013 | You .................. 257/71 |
| 2013/0119388 A1* | 5/2013 | Lee et al. .................. 257/59 |
| 2013/0126882 A1* | 5/2013 | You et al. .................. 257/71 |
| 2013/0134423 A1* | 5/2013 | Jin et al. .................. 257/59 |
| 2013/0134424 A1* | 5/2013 | Kim et al. .................. 257/59 |

* cited by examiner

THIN FILM TRANSISTOR ARRAY SUBSTRATE, ORGANIC LIGHT-EMITTING DISPLAY DEVICE INCLUDING THE SAME, AND METHOD OF MANUFACTURING THE SAME

CROSS-REFERENCE TO RELATED APPLICATIONS

This application claims the benefit of Korean Patent Application No. 10-2012-0106588, filed on Sep. 25, 2012, in the Korean Intellectual Property Office, the disclosure of which is incorporated herein in its entirety by reference.

BACKGROUND

1. Field

The present embodiments relate to a thin film transistor (TFT) array substrate, an organic light-emitting display device including the same, and a method of manufacturing the same.

2. Description of the Related Technology

Flat panel display devices, such as organic light-emitting display devices and liquid crystal display devices, include thin film transistors (TFTs), capacitors, and wirings for connecting them.

A substrate for forming flat panel display devices includes fine patterns of TFTs, capacitors, and wirings, and the fine patterns of the substrate may be generally formed by using a photo-lithography process in which a pattern is transferred by using a mask.

In a photo-lithography process, a photoresist is uniformly coated on a substrate on which a pattern is to be formed, is exposed to light by using an exposure device, such as a stepper, and then is developed (if the photoresist is a positive photoresist). After the photoresist is developed, the pattern on the substrate is etched by using the remaining photoresist, and the photoresist that is no longer needed after forming the pattern is removed.

In the above process of transferring a pattern by using a mask, since a mask having a desired pattern has to be prepared in advance, if the number of processes using masks is increased, manufacturing costs for preparing the masks are also increased. Also, due to the above-described complicated processes, a manufacturing process is complicated, a manufacturing time is increased, and thus manufacturing costs are increased.

SUMMARY OF CERTAIN INVENTIVE ASPECTS

The present embodiments provide a thin film transistor (TFT) array substrate having a simple manufacturing process and excellent signal transmission characteristics, an organic light-emitting display device including the same, and a method of manufacturing the same.

According to an aspect of the present embodiments, there is provided a thin film transistor (TFT) array substrate including a TFT including an active layer, a gate electrode, a source electrode, a drain electrode, a first gate insulating layer and a second gate insulating layer formed between the active layer and the gate electrode, and an interlayer insulating layer formed between the gate electrode and the source electrode and the drain electrode; a pixel electrode formed in an opening of the interlayer insulating layer, the pixel electrode including transparent conductive oxide; a translucent electrode formed in a region corresponding to the pixel electrode, between the first gate insulating layer and the second gate insulating layer; and a capacitor including a lower electrode formed from the same layer as the active layer, and an upper electrode formed from the same layer as the translucent electrode.

The translucent electrode may include a translucent metal layer.

The translucent metal layer may include silver (Ag) or an alloy of Ag.

In the translucent electrode, the translucent metal layer may be interposed between layers including transparent conductive oxide.

The transparent conductive oxide may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The pixel electrode may be formed from the same layer as the gate electrode.

The gate electrode may include a first layer including the transparent conductive oxide, and a second layer including metal having a resistance less than that of the first layer.

The lower electrode of the capacitor may include a semiconductor doped with an ion impurity.

The upper electrode of the capacitor may include a translucent metal layer.

An opening may be formed in the interlayer insulating layer to correspond to the upper electrode of the capacitor, and a planarization layer that covers the source electrode and the drain electrode may contact the second gate insulating layer through the opening.

According to another aspect of the present embodiments, there is provided an organic light-emitting display device including the above TFT array substrate; an intermediate layer including an organic emission layer formed on the pixel electrode; and a counter electrode formed on the intermediate layer.

The counter electrode may be a reflective electrode.

According to another aspect of the present embodiments, there is provided a method of manufacturing a thin film transistor (TFT) array substrate, the method including a first mask process for forming a semiconductor layer on a substrate, and patterning the semiconductor layer to form an active layer of a TFT and a lower electrode of a capacitor; a second mask process for forming a first gate insulating layer, forming a translucent metal layer on the first gate insulating layer, and patterning the translucent metal layer to form a translucent electrode and an upper electrode of the capacitor; a third mask process for forming a second gate insulating layer, forming on the second gate insulating layer a first layer including transparent conductive oxide and a second layer including metal, and patterning the first layer and the second layer to form a pixel electrode, a gate electrode, and a capacitor protection layer; a fourth mask process for forming an interlayer insulating layer, and forming in the interlayer insulating layer openings for exposing the pixel electrode, a source region and a drain region of the active layer, and the capacitor protection layer; and a fifth mask process for forming a metal layer, and patterning the metal layer to form a source electrode and a drain electrode.

In the second mask process, the translucent metal layer may include silver (Ag) or an alloy of Ag.

In the second mask process, the translucent metal layer may be foitned to include transparent conductive oxide.

After the third mask process is performed, the source region and the drain region of the active layer may be doped with an ion impurity.

In the fifth mask process, the capacitor protection layer may be removed.

After the capacitor protection layer is removed, the lower electrode may be doped with an ion impurity.

In the fifth mask process, the second layer of the pixel electrode may be removed together with the metal layer.

The method may further include a sixth mask process for forming a planarization layer, and forming in the planarization layer an opening corresponding to the pixel electrode.

BRIEF DESCRIPTION OF THE DRAWINGS

The above and other features and advantages of the present embodiments will become more apparent by describing in detail example embodiments thereof with reference to the attached drawings in which.

DETAILED DESCRIPTION OF CERTAIN INVENTIVE EMBODIMENTS

Hereinafter, the present embodiments will be described in detail by explaining example embodiments with reference to the attached drawings. As used herein, the term "and/or" includes any and all combinations of one or more of the associated listed items.

Figure 1:
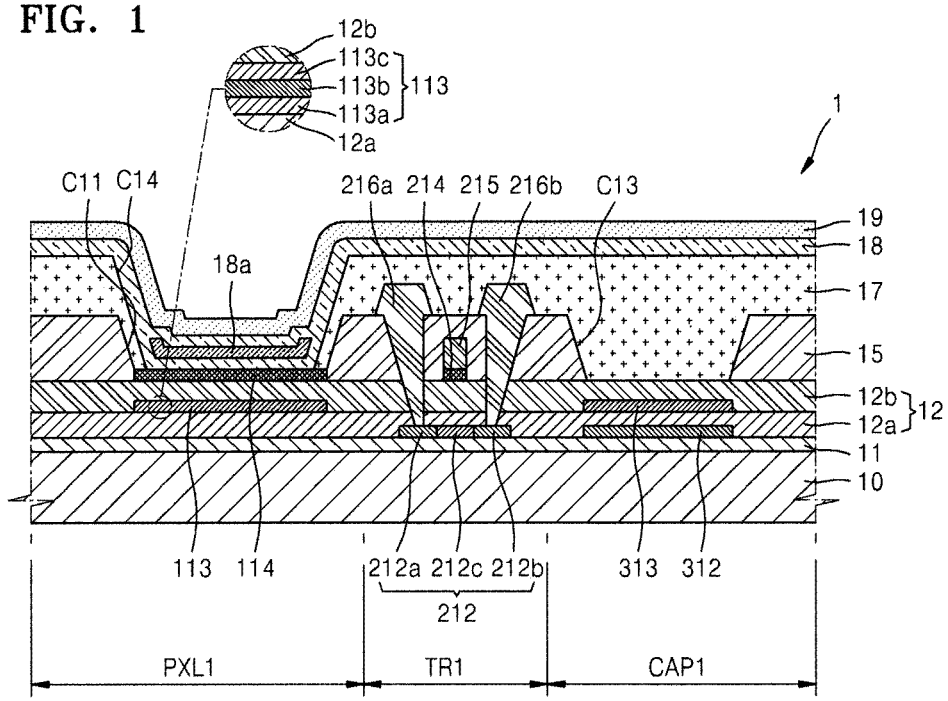
FIG. 1 is a cross-sectional view of organic light-emitting display device according to an embodiment.

FIG. 1 is a cross-sectional view of organic light-emitting display device 1 according to an embodiment.

Referring to FIG. 1, a pixel region PXL1, a transistor region TR1, and a capacitor region CAP1 are included in a substrate 10 of the organic light-emitting display device 1.

The substrate 10 may be formed as a transparent substrate, such as a glass substrate or a plastic substrate, including, for example, polyethylene terephthalate (PET), polyethylene naphthalate (PEN), or polyimide.

A buffer layer 11 may be formed on the substrate 10. The buffer layer 11 is used to form a flat surface on and to prevent penetration of impure elements into the substrate 10, and may be formed as a single or a plurality of layers by using, for example, silicon nitride and/or silicon oxide.

An active layer 212 is formed on the buffer layer 11. The active layer 212 may comprise a semiconductor including amorphous silicon or polysilicon. The active layer 212 may include a channel region 212c between a source region 212a and a drain region 212b doped with an ion impurity.

Gate electrodes 214 and 215 are formed on the active layer 212 with a first gate insulating layer 12a and a second gate insulating layer 12b therebetween so as to correspond to the channel region 212c of the active layer 212. To form the gate electrodes 214 and 215, a first layer and a second layer are sequentially formed, wherein the first layer includes a transparent conductive oxide and the second layer includes metal having a resistance less than that of the first layer.

The first layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The second layer may be formed as a single or a plurality of layers by using at least one metal selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

Although not shown in the drawing, a signal wiring, e.g., a scan signal wiring, which comprises the same material as the gate electrodes 214 and 215, may be formed on the second gate insulating layer 12b.

A source electrode 216a and a drain electrode 216b are formed on the gate electrodes 214 and 215 with the interlayer insulating layer 15 therebetween so as to respectively contact the source region 212a and the drain region 212b of the active layer 212. A planarization layer 17 is formed on the interlayer insulating layer 15 to cover the source electrode 216a and the drain electrode 216b.

A gate insulating layer 12 including the first gate insulating layer 12a and the second gate insulating layer 12b, and the interlayer insulating layer 15 may be formed as inorganic insulating layers. The planarization layer 17 may include a single organic insulating layer, or may include both an inorganic insulating layer and an organic insulating layer. The planarization layer 17 may include a general commonly-used polymer (polymethyl methacrylate (PMMA) or polystyrene (PS)), a polymer derivative having a phenol group, an acryl-based polymer, an imide-based polymer, an aryl ether-based polymer, an amide-based polymer, a fluorine-based polymer, a p-xylene-based polymer, a vinyl alcohol-based polymer, or a blend thereof.

In the pixel region PXL1, a translucent electrode 113 is formed between the first gate insulating layer 12a and the second gate insulating layer 12b.

The translucent electrode 113 may be include a translucent metal layer 113b including Ag or an alloy of Ag, and light may be partially transmitted or reflected by appropriately changing the thickness of the translucent electrode 113. The translucent electrode 113 to be described below may form a microcavity structure together with a counter electrode 19 that is a reflective electrode, and may improve an optical efficiency of the organic light-emitting display device 1 that is a bottom emission type display device.

In addition to the translucent metal layer 113b including Ag or an alloy of Ag, as illustrated in FIG. 1, the translucent electrode 113 may further include a protection layer 113c for protecting the translucent metal layer 113b from an etching environment, on the translucent metal layer 113b, and a bonding force enhancement layer 113a for reducing a bonding stress and enhancing a bonding force between the translucent metal layer 113b and the first gate insulating layer 12a, under the translucent metal layer 113b. In this case, the protection layer 113c and the bonding force enhancement layer 113a may include transparent conductive oxide.

In order to allow light to be emitted toward the substrate 10 and to dope a lower electrode 312 of a capacitor to be described below, a total thickness of the translucent electrode 113 may be from about 100 Angström (Å) to about 1,000 Å. In the translucent electrode 113, the translucent metal layer 113b may have a thickness of about 50 Å to about 300 Å, the protection layer 113c may have a thickness of about 50 Å to about 300 Å, and the bonding force enhancement layer 113a may have a thickness of about 50 Å to about 300 Å.

The second gate insulating layer 12b is formed on the translucent electrode 113, and a pixel electrode 114 is formed on the second gate insulating layer 12b to correspond to the translucent electrode 113.

The pixel electrode 114 may comprise transparent conductive oxide and thus light may be emitted through the pixel electrode 114. The transparent conductive oxide may include at least one selected from the group consisting of ITO, IZO, ZnO, $In_2O_3$, IGO, and AZO.

In the current embodiment, since the translucent electrode 113 and the pixel electrode 114 are not formed from the same layer but are formed from different layers by using different etching processes, the translucent electrode 113 may be prevented from damage due to an etchant when the translucent electrode 113 is etched together with the pixel electrode 114.

The planarization layer 17 is formed outside the pixel electrode 114, and an opening C14 is formed in the planarization layer 17 to expose the pixel electrode 114. An organic emission layer 18a is formed in the opening C14, and an intermediate layer 18, including the organic emission layer 18a, is formed on the pixel electrode 114.

The organic emission layer 18a may comprise a low-molecular organic material or a high-molecular organic material. If the organic emission layer 18a comprises a low-molecular organic material, the intermediate layer 18 may include a stack of, for example, a hole transport layer (HTL), a hole injection layer (HIL), an electron transport layer (ETL), and an electron injection layer (EIL). In addition to the above layers, various layers may be stacked according to necessity. In this case, various organic materials including copper phthalocyanine (CuPc), N'-Di(naphthalene-1-yl)-N,N'-diphenyl-benzidine (NPB), tris-8-hydroxyquinoline aluminum ($Alq_3$) may be used. Otherwise, if the organic emission layer 18a comprises a high-molecular organic material, the intermediate layer 18 may include an HTL. The HTL may comprise poly-(3,4)-ethylene-dihydroxy thiophene (PEDOT) or polyaniline (PANI). In this case, poly-phenylenevinylene (PPV)-based and polyfluorene-based high-molecular organic materials may be used. The organic emission layer 18a may form one unit pixel as a sub pixel for emitting red, green, or blue light.

The counter electrode 19 is vapor-deposited on the organic emission layer 18a as a common electrode. The counter electrode 19 may be formed as a reflective electrode. The counter electrode 19 may be formed as a reflective electrode including a reflective material. In this case, the counter electrode 19 may include at least one selected from the group consisting of Al, Mg, Li, Ca, LiF/Ca, and LiF/Al. Since the counter electrode 19 is formed as a reflective electrode, light emitted from the organic emission layer 18a is reflected on the counter electrode 19 and is transmitted through the pixel electrode 114 comprising transparent conductive oxide. In this case, light emitted from the organic emission layer 18a resonates between the translucent electrode 113 and the counter electrode 19 that is a reflective electrode, and an overall efficiency of light emitted toward the substrate 10 is increased.

In the organic light-emitting display device 1, the pixel electrode 114 is used as an anode, and the counter electrode 19 is used as a cathode, or vice versa.

Although the organic emission layer 18a is formed in the opening C14 and thus each pixel has a different light-emitting material in the above description, the current embodiment is not limited thereto. The organic emission layer 18a may be commonly formed over the entire intermediate layer 18 regardless of locations of pixels. In this case, the organic emission layer 18a may be formed, for example, by vertically stacking or mixing layers including light-emitting materials for emitting red, green, or blue light.

In the capacitor region CAP1, the lower electrode 312 of the capacitor, which comprises the same material as the active layer 212 of a thin film transistor (TFT), is formed on the buffer layer 11.

The lower electrode 312 may comprise the same material as the source region 212a and the drain region 212b of the active layer 212 of the TFT, and may include a semiconductor doped with an ion impurity. If the lower electrode 312 comprises an intrinsic semiconductor, the capacitor forms a metal-oxide-semiconductor (MOS) capacitor structure together with an upper electrode 313. However, if the lower electrode 312 comprises a semiconductor doped with an ion impurity as described above, since the capacitor forms a metal-insulator-metal (MIM) capacitor structure, an electrostatic capacitance may be maximized and a voltage margin may be increased.

The upper electrode 313 is formed on the first gate insulating layer 12a. Like the translucent electrode 113, the upper electrode 313 is formed as a translucent metal layer. In the current embodiment, since only the first gate insulating layer 12a is formed between the lower electrode 312 and the upper electrode 313, a capacitor capacitance is increased. Accordingly, since a margin for reducing an area of the capacitor is increased by the increased amount of the capacitance, the pixel electrode 114 may be formed in a large size and thus an aperture ratio may be increased.

The second gate insulating layer 12b is formed on the upper electrode 313 to directly contact the upper electrode 313, and the interlayer insulating layer 15 having an opening C13 corresponding to the lower electrode 312 and the upper electrode 313 is formed on the second gate insulating layer 12b.

The planarization layer 17 is formed in the opening C13 of the interlayer insulating layer 15, and thus the second gate insulating layer 12b and the planarization layer 17 directly contact each other in the opening C13. Since the second gate insulating layer 12b and the planarization layer 17 are interposed between the upper electrode 313 and the counter electrode 19, a parasitic capacitance between the upper electrode 313 and the counter electrode 19 may be reduced.

A method of manufacturing the organic light-emitting display device 1 will now be described with reference to FIGS. 2A through 2F.

Figure 2A:
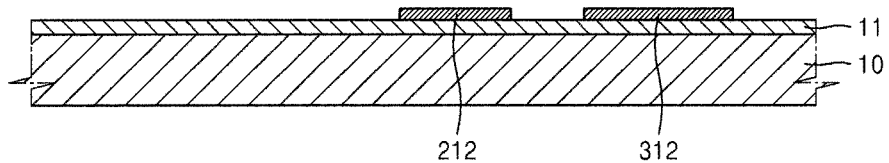
FIGS. 2A through 2F are cross-sectional views for describing a method of manufacturing the organic light-emitting display device illustrated in FIG. 1.

FIG. 2A is a cross-sectional view showing a result of performing a first mask process of the organic light-emitting display device 1.

Referring to FIG. 2A, the buffer layer 11 and a semiconductor layer (not shown) are sequentially formed on the substrate 10, and the semiconductor layer is patterned to form the active layer 212 of the TFT and the lower electrode 312 of the capacitor.

Although not shown in the drawing, the buffer layer 11 and the semiconductor layer are vapor-deposited on the substrate 10, a photoresist (not shown) is coated on the semiconductor layer, and a photo-lithography process using a first photomask (not shown), e.g., the first mask process, is performed to pattern the semiconductor layer into the active layer 212 and the lower electrode 312 are formed. The first mask process is performed by exposing the first photomask to light by using an exposure device (not shown), and then performing a series of processes, such as developing, etching, and stripping or ashing.

The semiconductor layer may comprise amorphous silicon or polysilicon. In this case, polysilicon may be formed by crystallizing amorphous silicon. Amorphous silicon may be crystallized by using various methods, such as rapid thermal annealing (RTA), solid phase crystallization (SPC), excimer laser annealing (ELA), metal-induced crystallization (MIC), metal-induced lateral crystallization (MILC), and sequential lateral solidification (SLS).

Figure 2B:
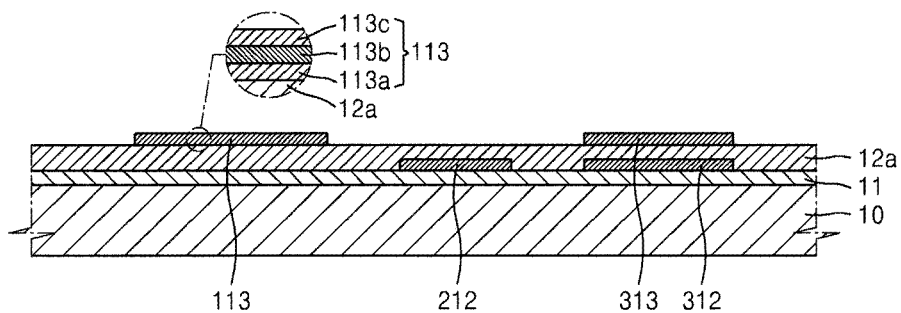

FIG. 2B is a cross-sectional view showing a result of performing a second mask process of the organic light-emitting display device 1.

Referring to FIG. 2B, the first gate insulating layer 12a and a translucent material layer (not shown) are sequentially stacked on a result of the first mask process of FIG. 2A, and then the translucent material layer is patterned.

As a result of the patterning, the translucent electrode 113 and the upper electrode 313 of the capacitor are formed on the first gate insulating layer 12a. The first gate insulating layer 12a functions as a gate insulating layer of the TFT, and a dielectric layer of the capacitor.

The first gate insulating layer 12a may be formed as a single or a plurality of inorganic insulating layers including a material selected from $SiO_2$, $SiN_x$, SiON, $Al_2O_3$, $TiO_2$, $Ta_2O_5$, $HfO_2$, $ZrO_2$, barium strontium titanate (BST), and lead zirconate titanate (PZT), and the translucent electrode 113 may include the translucent metal layer 113b including Ag or an alloy of Ag.

In addition to the translucent metal layer 113b including Ag or an alloy of Ag, the translucent electrode 113 may further include the protection layer 113c for protecting the translucent metal layer 113b from an etching environment, and a bonding force enhancement layer 113a for enhancing a bonding force between the translucent metal layer 113b and the first gate insulating layer 12a.

Figure 2C:
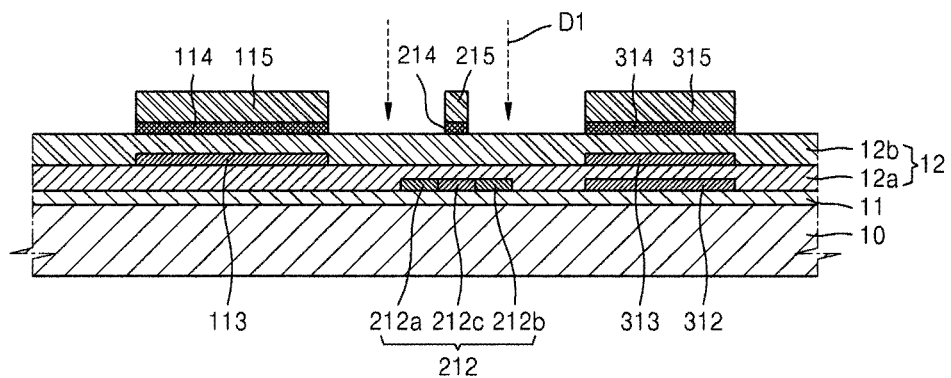

FIG. 2C is a cross-sectional view showing a result of performing a third mask process of the organic light-emitting display device 1.

Referring to FIG. 2C, the second gate insulating layer 12b, a transparent conductive oxide layer (not shown), and a metal layer (not shown) are sequentially stacked on a result of the second mask process of FIG. 2B, and then the transparent conductive oxide layer and the metal layer are patterned.

The second gate insulating layer 12b may be formed as an inorganic insulating layer including a material selected from $SiO_2$, $SiN_x$, SiON, $Al_2O_3$, $TiO_2$, $Ta_2O_5$, $HfO_2$, $ZrO_2$, BST, and PZT, and the transparent conductive oxide layer may include at least one selected from the group consisting of ITO, IZO, ZnO, $In_2O_3$, IGO, and AZO. The metal layer may include metal having a resistance less than that of the transparent conductive oxide layer. Various metals may be formed as a single or a plurality of layers, and a triple-layer wiring of Mo/Al/Mo is used here.

As a result of the patterning, a portion to be the pixel electrode 114, a pixel electrode upper layer 115, the gate electrodes 214 and 215, and capacitor protection layers 314 and 315 are formed on the second gate insulating layer 12b.

The metal layer may be formed as a single or a plurality of layers including at least one metal selected from the group consisting of Al, Pt, Pd, Ag, Mg, Au, Ni, Nd, Ir, Cr, Li, Ca, Mo, Ti, W, and Cu.

The above structure is doped with an ion impurity. The ion impurity may include boron (B) or phosphorus (P) ions, and primary doping (D1) is performed by using the active layer 212 of the TFT as a target to a density equal to or greater than $1 \times 10^{15}$ atoms/cm².

The active layer 212 is doped with the ion impurity by using the gate electrode 214 and 215 as a self-aligned mask. As such, the source region 212a and the drain region 212b that are doped with the ion impurity, and the channel region 212c interposed therebetween are formed in the active layer 212. Although not shown in the drawing, a wiring that is connected to the lower electrode 312 comprising the same material as the active layer 212 is doped together with the active layer 212. However, since the capacitor protection layers 314 and 315 function as a mask, the lower electrode 312 of the capacitor is not doped yet.

Figure 2D:
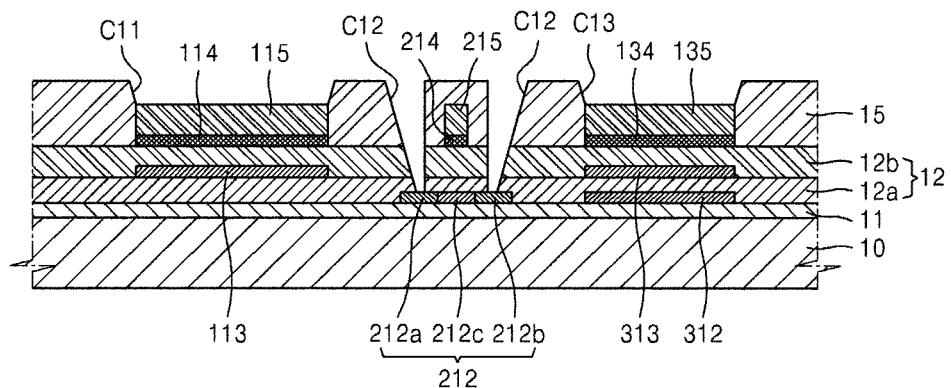

FIG. 2D is a cross-sectional view showing a result of performing a fourth mask process of the organic light-emitting display device 1.

Referring to FIG. 2D, the interlayer insulating layer 15 is formed on a result of the third mask process of FIG. 2C, and then is patterned to form an opening C11 for exposing the pixel electrode upper layer 115, openings C12 for exposing portions of the source region 212a and the drain region 212b of the active layer 212, and the opening C13 for exposing the capacitor protection layer 315.

Figure 2E:
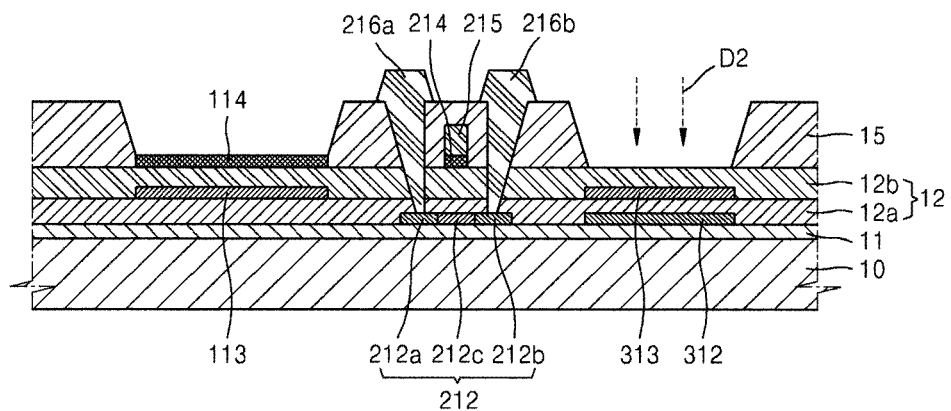

FIG. 2E is a cross-sectional view showing a result of performing a fifth mask process of the organic light-emitting display device 1.

Referring to FIG. 2E, a metal layer (not shown) is formed on a result of the fourth mask process of FIG. 2D, and then is patterned to form the source electrode 216a and the drain electrode 216b.

The metal layer may be formed as a single or a plurality of layers including at least one metal selected from the group consisting of Al, Pt, Pd, Ag, Mg, Au, Ni, Nd, Ir, Cr, Li, Ca, Mo, Ti, W, and Cu.

When the source electrode 216a and the drain electrode 216b are formed, the pixel electrode upper layer 115 and the capacitor protection layers 314 and 315 are also etched.

After the capacitor protection layers 314 and 315 are etched, secondary doping D2 is performed by using the lower electrode 312 as a target. In this case, like the above-described translucent electrode 113, a total thickness of the upper electrode 313 may be from about 100 Å to about 1,000 Å. The upper electrode 313 comprises the same material as the translucent electrode 113.

Since the lower electrode 312 is doped and thus the capacitor forms an MIM capacitor structure, an electrostatic capacitance may be maximized and a voltage margin may be increased.

Figure 2F:
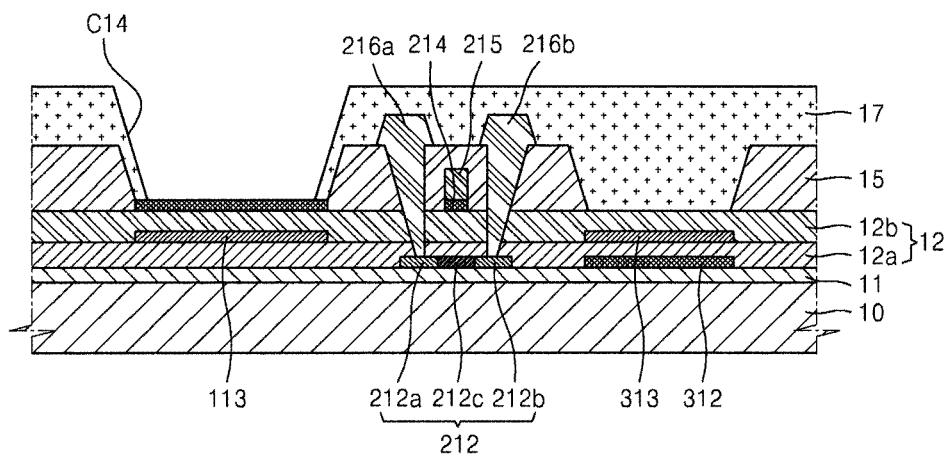

FIG. 2F is a cross-sectional view showing a result of performing a sixth mask process of the organic light-emitting display device 1.

Referring to FIG. 2F, the planarization layer 17 is formed on a result of the fifth mask process of FIG. 2E, and then the opening C14 for exposing an upper surface of the pixel electrode 114 is formed in the planarization layer 17.

As described above, according to the organic light-emitting display device 1, since the translucent electrode 113 is formed under the pixel electrode 114 as a separate layer, the translucent electrode 113 may be prevented from being damaged due to etching.

Also, since the lower electrode 312 doped with an ion impurity and the upper electrode 313 including translucent metal are used as a capacitor and thus an MIM capacitor structure is formed, an electrostatic capacitance may be maximized and a voltage margin may be increased. Furthermore, since a dielectric layer of the capacitor is formed to be thin by using one gate insulating layer, the electrostatic capacitance may be increased. Consequently, the capacitor may have a small size and thus an aperture ratio may be increased.

The present embodiments will now be compared to a comparative example with reference to FIGS. 3, and 4A through 4E.

Figure 3:
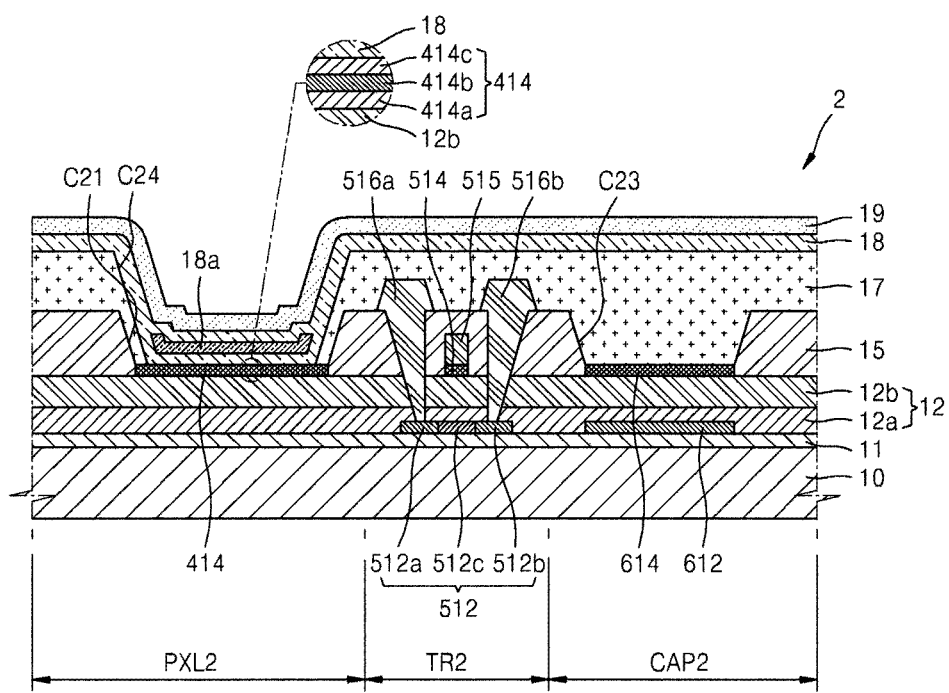
FIG. 3 is a cross-sectional view of an organic light-emitting display device according to a comparative example of the present embodiments.

FIG. 3 is a cross-sectional view of an organic light-emitting display device 2 according to a comparative example of the present embodiments.

Referring to FIG. 3, the organic light-emitting display device 2 includes a pixel region PXL2, a transistor region TR2, and a capacitor region CAP2.

In order to achieve a micro-cavity effect in the pixel region PXL2, a pixel electrode 414 may include a translucent metal layer 414b. In addition, as illustrated in FIG. 3, a bonding force enhancement layer 414a and a protection layer 414c may be further formed. In this case, the pixel electrode 414 itself functions as a translucent electrode. However, as described below, the translucent metal layer 414b of the pixel electrode 414 is damaged during an etching process. Accordingly, a resonance effect is reduced.

A lower electrode 612 of a capacitor includes a semiconductor doped with an ion impurity, and an upper electrode 614 forms an MIM capacitor including a translucent metal layer. However, since a first gate insulating layer 12a and a second gate insulating layer 12b function as a dielectric layer, and thus the thickness of the dielectric layer is large, an electrostatic capacitance is small in comparison to the organic light-emitting display device 1 illustrated in FIG. 1. Accordingly, a high aperture ratio may not be easily achieved.

FIGS. 4A through 4E are cross-sectional views for describing a method of manufacturing the organic light-emitting display device 2 illustrated in FIG. 2.

Figure 4A:
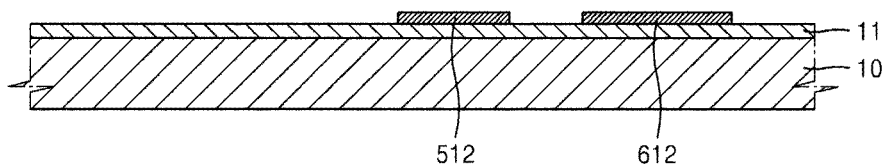
FIGS. 4A through 4E are cross-sectional views for describing a method of manufacturing the organic light-emitting display device illustrated in FIG. 2.

Referring to FIG. 4A, an active layer 512 and the lower electrode 612, which have not been doped with an ion impurity, are formed on a substrate 10.

Figure 4B:
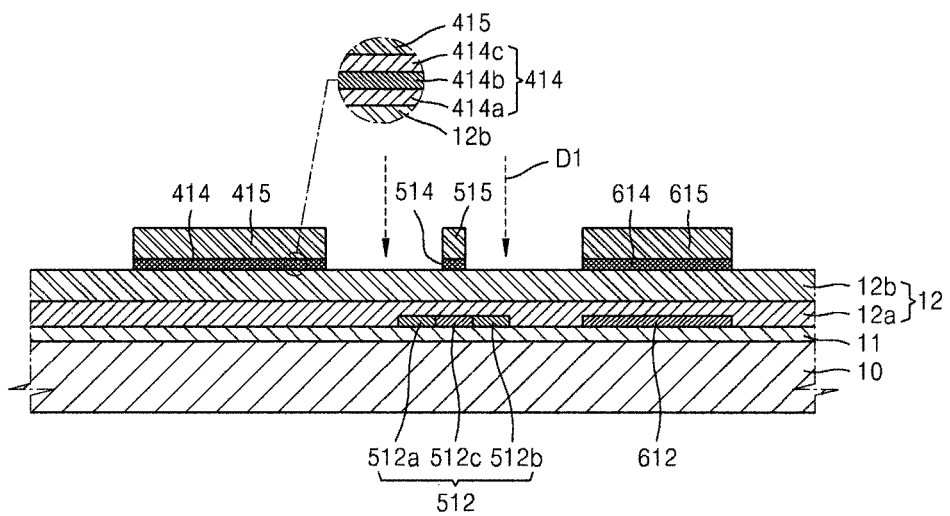

Referring to FIG. 4B, a transparent conductive oxide layer and a low-resistance metal layer are sequentially stacked and then patterned to form pixel electrodes 414 and 415, gate electrodes 514 and 515, and upper electrodes 614 and 615 of the capacitor, and then primary doping D1 is performed. As a result, the active layer 512 includes a source region 512a and a drain region 512b doped with an ion impurity, and a channel region 512c. Since the upper electrodes 614 and 615 function as a mask, the lower electrode 612 blocked by the upper electrodes 614 and 615 may not be doped.

Figure 4C:
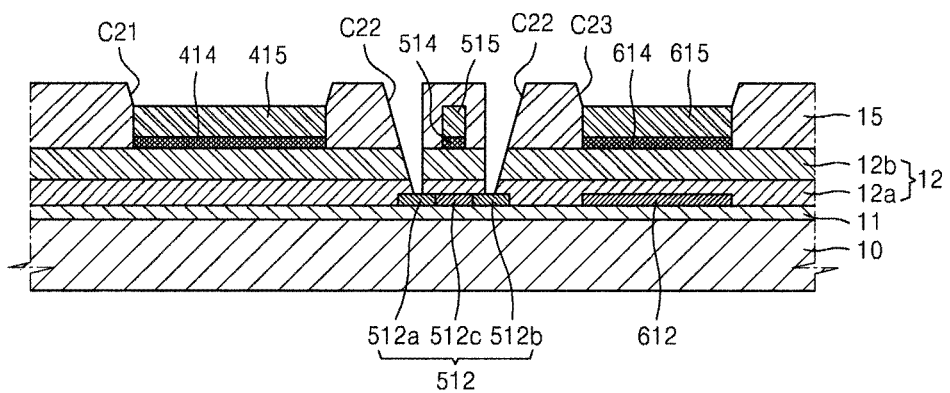

Referring to FIG. 4C, an interlayer insulating layer 15 is formed and then an opening C21 for exposing the pixel electrode 115, openings C22 for exposing portions of the source region 512a and the drain region 512b of the active layer 512, and an opening C23 for exposing the upper electrode 615 are formed.

Figure 4D:
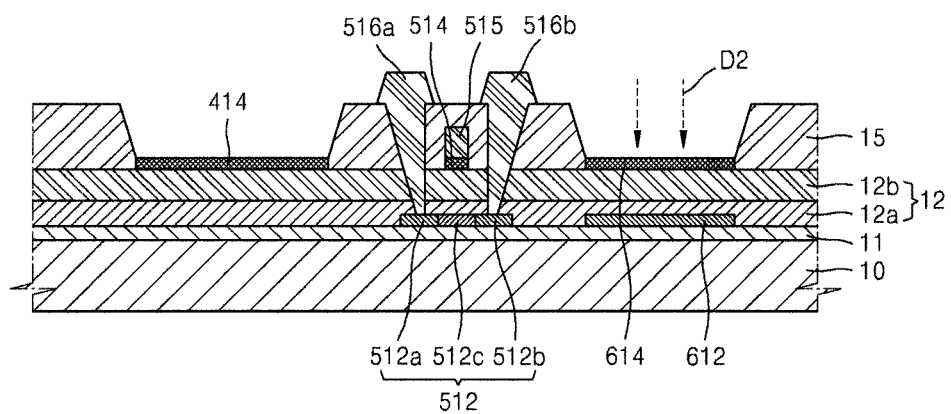

Referring to FIG. 4D, a metal layer (not shown) is formed on a result of the process of FIG. 4C to fill the openings C21, C22, and C23, and then is patterned to form a source electrode 516a and a drain electrode 516b. In this case, the pixel electrode 415 and the upper electrode 615 are also removed. Then, secondary doping D2 is performed. Due to the secondary doping D2, the lower electrode 612 is doped. Since the first gate insulating layer 12a and the second gate insulating layer 12b function as a dielectric layer between the lower electrode 612 and the upper electrode 614, an electrostatic capacitance may not be easily increased.

Figure 4E:
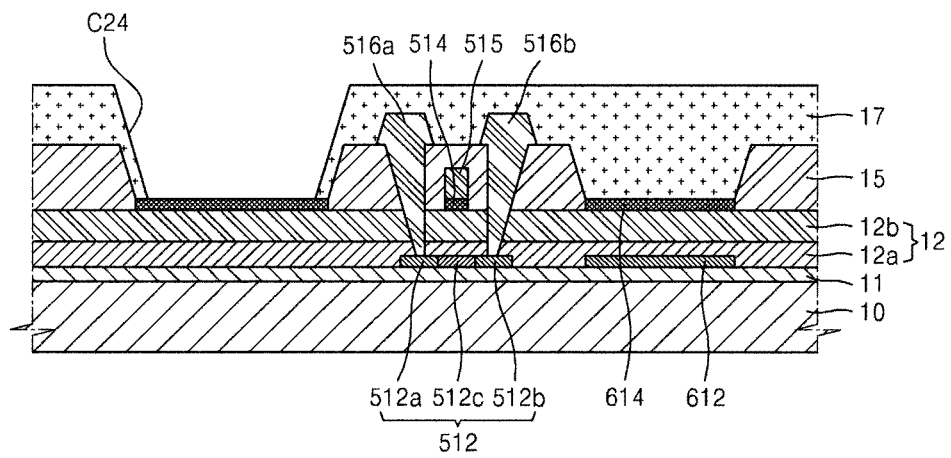

Referring to FIG. 4E, a planarization layer 17 is formed on a result of the process of FIG. 4D and then is patterned to form an opening C24 for exposing the pixel electrode 414.

According to the comparative example, since the pixel electrode 414 including translucent metal may be damaged during an etching process, an effective resonance effect may not be easily achieved, an electrostatic capacitance of a capacitor may not be easily increased, and thus an aperture ratio may not be easily increased by reducing the size of the capacitor.

In a TFT array substrate, an organic light-emitting display device including the same, and a method of manufacturing the same, according to the present embodiments, since a translucent electrode is formed under a pixel electrode 114 as a separate layer, the translucent electrode may be prevented from being damaged due to etching. Also, since an active layer doped with an ion impurity and the translucent electrode are used as a capacitor and thus an MIM capacitor structure is formed, an electrostatic capacitance may be maximized and a voltage margin may be increased. Furthermore, since a dielectric layer of the capacitor is formed to be thin by using one gate insulating layer, the electrostatic capacitance may be increased. Consequently, the capacitor may have a small size and thus an aperture ratio may be increased.

While the present embodiments have been particularly shown and described with reference to example embodiments thereof, it will be understood by those of ordinary skill in the art that various changes in form and details may be made therein without departing from the spirit and scope of the present embodiments as defined by the following claims.

What is claimed is:

1. A thin film transistor (TFT) array substrate comprising:
   a TFT comprising an active layer, a gate electrode, a source electrode, a drain electrode, a first gate insulating layer and a second gate insulating layer formed between the active layer and the gate electrode, and an interlayer insulating layer formed between the gate electrode and the source electrode and between the gate electrode and the drain electrode;
   a pixel electrode formed in an opening of the interlayer insulating layer, the pixel electrode comprising a transparent conductive oxide;
   a translucent electrode formed in a region corresponding to the pixel electrode, between the first gate insulating layer and the second gate insulating layer; and
   a capacitor comprising a lower electrode formed from the same layer as the active layer, and an upper electrode formed from the same layer as the translucent electrode.

2. The TFT array substrate of claim 1, wherein the translucent electrode comprises a translucent metal layer.

3. The TFT array substrate of claim 2, wherein the translucent metal layer comprises silver (Ag) or an alloy comprising Ag.

4. The TFT array substrate of claim 2, wherein, in the translucent electrode, the translucent metal layer is interposed between layers comprising transparent conductive oxide.

5. The TFT array substrate of claim 1, wherein the transparent conductive oxide comprises at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

6. The TFT array substrate of claim 1, wherein the pixel electrode is formed from the same layer as the gate electrode.

7. The TFT array substrate of claim 1, wherein the gate electrode comprises a first layer comprising the transparent conductive oxide, and a second layer comprising metal having a resistance less than that of the first layer.

8. The TFT array substrate of claim 1, wherein the lower electrode of the capacitor comprises a semiconductor doped with an ion impurity.

9. The TFT array substrate of claim 8, wherein the upper electrode of the capacitor comprises a translucent metal layer.

10. The TFT array substrate of claim 1, wherein an opening is formed in the interlayer insulating layer corresponding to the upper electrode of the capacitor, and a planarization layer that covers the source electrode and the drain electrode contacts the second gate insulating layer through the opening.

11. An organic light-emitting display device comprising:
    a thin film transistor (TFT) array substrate comprising:

a TFT comprising an active layer, a gate electrode, a source electrode, a drain electrode, a first gate insulating layer and a second gate insulating layer formed between the active layer and the gate electrode, and an interlayer insulating layer formed between the gate electrode and the source electrode and between the gate electrode and the drain electrode;

a pixel electrode formed in an opening of the interlayer insulating layer, the pixel electrode comprising a transparent conductive oxide;

a translucent electrode formed in a region corresponding to the pixel electrode, between the first gate insulating layer and the second gate insulating layer; and a capacitor comprising a lower electrode formed from the same layer as the active layer, and an upper electrode formed from the same layer as the translucent electrode;

an intermediate layer comprising an organic emission layer formed on the pixel electrode; and a counter electrode formed on the intermediate layer.

12. The organic light-emitting display device of claim 11, wherein the counter electrode is a reflective electrode.

* * * * *